(12) United States Patent
Fluegel

(10) Patent No.: US 12,080,033 B1
(45) Date of Patent: Sep. 3, 2024

(54) HYBRID COMPRESSION FOR SPARSE BINARY IMAGES

(71) Applicant: Apple Inc., Cupertino, CA (US)

(72) Inventor: Sebastian Fluegel, Munich (DE)

(73) Assignee: Apple Inc., Cupertino, CA (US)

( * ) Notice: Subject to any disclaimer, the term of this patent is extended or adjusted under 35 U.S.C. 154(b) by 495 days.

(21) Appl. No.: 17/509,775

(22) Filed: Oct. 25, 2021

Related U.S. Application Data

(60) Provisional application No. 63/169,020, filed on Mar. 31, 2021, provisional application No. 63/116,737, filed on Nov. 20, 2020.

(51) Int. Cl.
| | |
|---|---|
| G06T 9/00 | (2006.01) |
| H03M 7/30 | (2006.01) |
| H03M 7/40 | (2006.01) |
| H04N 23/60 | (2023.01) |
| H04N 23/80 | (2023.01) |
| H04N 25/47 | (2023.01) |

(52) U.S. Cl.
CPC ............. *G06T 9/00* (2013.01); *H03M 7/3064* (2013.01); *H03M 7/40* (2013.01); *H03M 7/6011* (2013.01); *H04N 23/665* (2023.01); *H04N 23/80* (2023.01); *H04N 25/47* (2023.01)

(58) Field of Classification Search
CPC ....... H04N 23/665; H04N 23/80; H04N 25/47
See application file for complete search history.

(56) References Cited

U.S. PATENT DOCUMENTS

| | | | |
|---|---|---|---|
| 8,270,475 B2 | 9/2012 | Sato et al. | |
| 8,275,045 B2 | 9/2012 | Ye et al. | |
| 9,386,318 B2 | 7/2016 | Ridenour et al. | |
| 10,313,588 B2 * | 6/2019 | Ikedo | H04N 23/6811 |
| 11,495,008 B2 * | 11/2022 | Takatsuka | H04N 25/443 |
| 2011/0033126 A1 | 2/2011 | Liu et al. | |
| 2018/0302561 A1 * | 10/2018 | Ikedo | H04N 23/672 |
| 2021/0256286 A1 * | 8/2021 | Takatsuka | G06V 40/10 |
| 2022/0210317 A1 * | 6/2022 | Takatsuka | H04N 23/80 |

OTHER PUBLICATIONS

Yiqi Tew, et al., "Information Hiding in HEVC Standard Using Adaptive Coding Block Size Decision", 2014 IEEE International Conference on Image Processing (ICIP), 2014, pp. 5502-5506, doi: 10.1109/ICIP.2014.7026113.

* cited by examiner

*Primary Examiner* — Nicholas G Giles

(74) *Attorney, Agent, or Firm* — Robert C. Kowert; Kowert, Hood, Munyon, Rankin & Goetzel, P.C.

(57) ABSTRACT

Systems and methods are disclosed for a hybrid image compression technique. The technique may be used to reduce the size of sparse binary images in a lossless fashion for transmission over a low-bandwidth channel and using less power. In embodiments, a received image is partitioned into pixel blocks. Sequences of empty blocks are encoded as a skip counter that indicates the length of the sequence. Non-empty blocks are encoded using one of several block encoding techniques selected based on the length of the resulting block encoding. In embodiments, a loss report may be included in the compressed data stream if blocks are lost due to buffer overflow. In embodiments, the block skip counter is encoded using a variable length code that maps more common skip values to shorter bit widths. In embodiments, the variable length code may be changed periodically to adapt to the characteristics of recent images.

20 Claims, 7 Drawing Sheets

HYBRID COMPRESSION FOR SPARSE BINARY IMAGES

This application claims benefit of priority to U.S. Provisional Application Ser. No. 63/116,737, entitled "Hybrid Compression for Sparse Binary Images," filed Nov. 20, 2020, and claims benefit of priority to U.S. Provisional Application Ser. No. 63/169,020, entitled "Hybrid Compression for Sparse Binary Images", filed Mar. 31, 2021, and which are hereby incorporated herein by reference in their entirety.

BACKGROUND

Technical Field

This disclosure relates generally to image compression and, more specifically, a hybrid compression technique for sparse binary images using a mix of different image compression techniques.

Description of the Related Art

Image sensors for high-speed binary images are used in many types of machine vision applications. These sensors can capture a huge amount of raw data for downstream processing, which are sent over a communication channel to a downstream image processing unit. The need to quickly transmit large amounts of image data over the communication channel creates difficult tradeoffs in these systems. To implement a very fast channel, substantial logic resources must be built into both the sensor and the image processing unit, which increases the complexity and power consumption of these devices. Indeed, in some systems, the sensor's power consumption is dominated by its data transmission logic, which must remain in an active state for long periods of time. On the other hand, a slower communication channel can be easily overflowed by bursts of captured data, causing periodic loss of data. These problems are not adequately resolved by the systems of the state of the art.

SUMMARY OF EMBODIMENTS

Systems and methods are disclosed herein to implement a hybrid image compression technique. The technique may be used to reduce the size of sparse binary images in a lossless fashion so that the images can be transmitted over a low-bandwidth communication channel and using less power. In some embodiments, a captured image is partitioned into pixel blocks. Sequences of empty blocks (blocks with no active pixels) are encoded using a skip counter that indicates the length of the sequence. In some embodiments, the skip counter is encoded using a variable length code that is automatically updated to adapt to the changing characteristics of the images. In some embodiments, non-empty blocks are encoded using one of several block encoding techniques selected based on the length of the resulting block encoding. In some embodiments, a loss report may be included in the compressed data stream if blocks are lost due to buffer overflow. In some embodiments, the hybrid image compression technique is implemented by an image sensor that transmits the images over a communication channel to an image processor. The image compression reduces the image sensor's power usage by allowing the sensor's data transmitter to be periodically placed into an inactive state.

Figure 1:
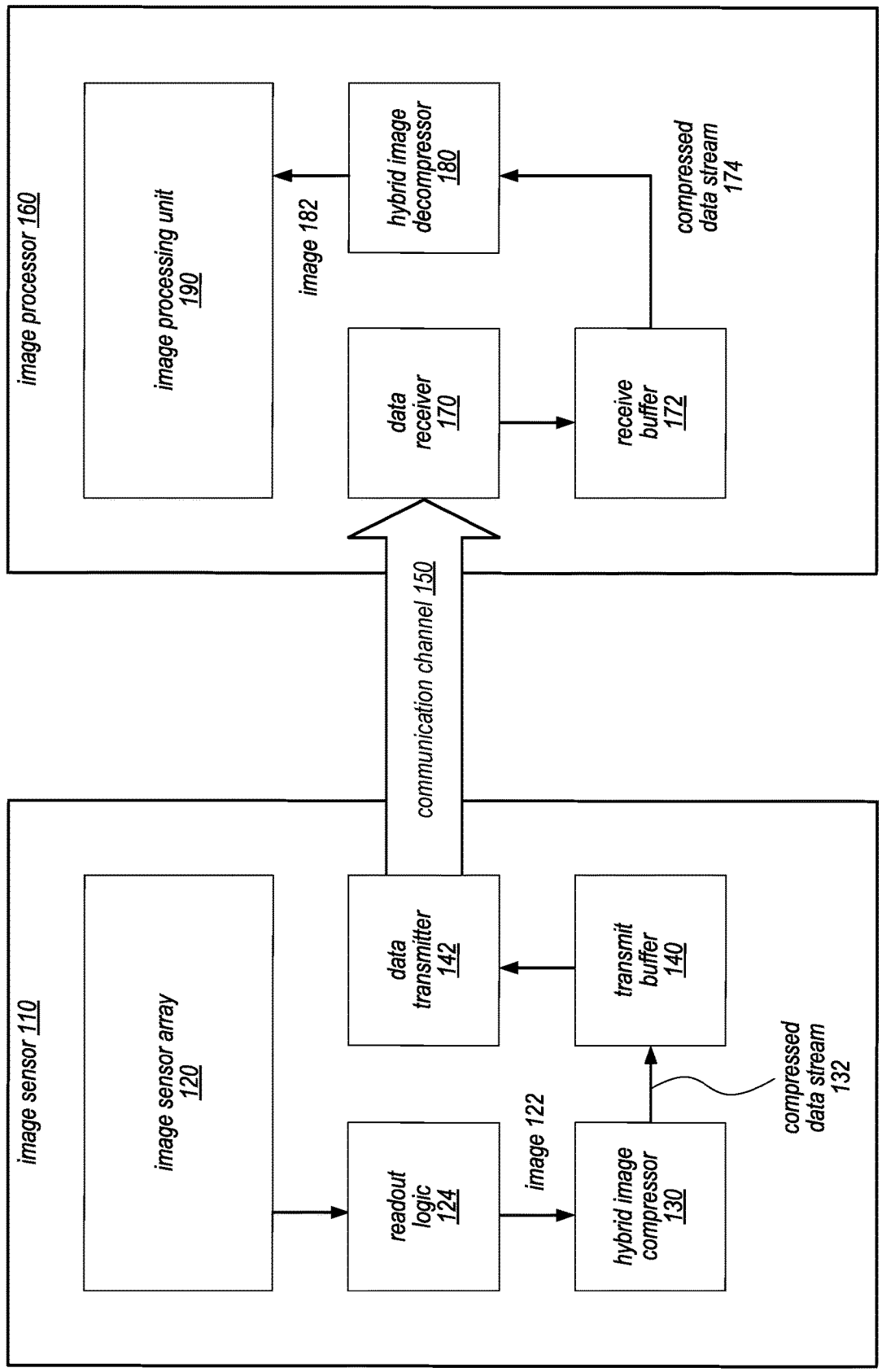
FIG. 1 is a block diagram illustrating components of an example image processing system configured to compress captured images for transmission over a communication channel, according to some embodiments.

This disclosure may include references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "neural network engine configured to implement a neural network" is intended to cover, for example, circuitry performing this function during operation, even if the circuitry in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible. Thus, the "configured to" construct is not used herein to refer to a software entity such as an application programming interface (API).

The term "configured to" is not intended to mean "configurable to." An unprogrammed FPGA, for example, would not be considered to be "configured to" perform some specific function, although it may be "configurable to" perform that function and may be "configured to" perform the function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the terms "first," "second," etc. are used as labels for nouns that they precede, and do not imply any type of ordering (e.g., spatial, temporal, logical, etc.) unless specifically stated. For example, in a processor having eight processing cores, the terms "first" and "second" processing cores can be used to refer to any two of the eight processing cores. In other words, the "first" and "second" processing cores are not limited to processing cores 0 and 1, for example.

As used herein, the term "based on" is used to describe one or more factors that affect a determination. This term does not foreclose the possibility that additional factors may affect a determination. That is, a determination may be solely based on specified factors or based on the specified factors as well as other, unspecified factors. Consider the phrase "determine A based on B." This phrase specifies that B is a factor used to determine A or that affects the determination of A. This phrase does not foreclose that the determination of A may also be based on some other factor, such as C. This phrase is also intended to cover an embodiment in which A is determined based solely on B. As used herein, the phrase "based on" is thus synonymous with the phrase "based at least in part on."

DETAILED DESCRIPTION

The present disclosure describes embodiments of image processing devices that use one or more data compression techniques to improve the speed and reliability of image data transmission from an image sensor to an image processing unit over a low bandwidth communication channel and using less power. In some embodiments of the image processing system, the captured images are a sparse collection of binary pixels. These sparse binary images are used in many types of real-time machine vision applications, such as object detection, image classification, user eye tracking, etc. In some embodiments, the image sensor is implemented as part of an event camera that is used to detect changes in an observed scene. Such a sensor may be used to monitor the scene so that when the brightness of a particular pixel sufficiently changes from one frame to the next, that pixel will be activated in the binary image. As may be appreciated, the binary images captured in this context are sparse (i.e. mostly black) because usually no changes are detected in the scene.

Compression of the image data provides a number of advantages in image processing systems, including lower power consumption and lower transmission latency. In some embodiments, the disclosed hybrid image compression techniques allow for the use of a slower data transmission channel, which consumes significantly less power in the active-state. In some embodiments, compression may allow the image data to be sent in bursts. This allows the data transmitter to be kept in an inactive state (e.g. unpowered or low-power state) for extended periods of the time between transmissions (e.g. when the transmission buffer is below capacity threshold). Moreover, a slower transmission channel typically requires less logic resources in the image sensor and in the image processor. Further, the disclosed hybrid image compression technique is extremely flexible. While the encoding is optimized for images that are mostly black, it is able to represent images with mostly white pixels with no loss of information. In one study, an embodiment of the hybrid image compressor as disclosed herein was used to transmit sparse binary image data from the sensor to the image processor without loss of information. The hybrid image compressor achieved a compression ratio of between 1:25 and 1:200, depending on the image contents.

Embodiments of the disclosed hybrid image compression techniques may be implemented as part of an image processing system that employs an image sensor. In some embodiments, the hybrid image compression techniques may be implemented by a data compression unit and a transmit buffer within the image sensor. The data compression unit may be integrated into the transmit interface of the image sensor. The data compressor unit will reduce the amount of data to be transmitted. In some embodiments, the compression allows the transmission logic to be kept in an inactive state when the transmit buffer is below a capacity threshold, so that the image sensor will use less power.

In some embodiments, in order to compress an image, the image is partitioned into equal-size blocks and using a set of different block encoding methods. In some embodiments, the compression method encodes the image by repeatedly generating: (1) the number of empty blocks that are skipped, and (2) an encoded description of active pixel(s) in a next non-empty block. In some embodiments, the different block encoding methods may be dynamically selected based on the properties of each block. In some cases where a non-empty block includes only a single active pixel, the description may indicate the index of the active pixel within the block. In some cases where the non-empty block includes multiple active pixels, the description may indicate the gaps (or distances) between the active pixels in the block. In some cases where the non-empty block includes a large number of active pixels, the description may indicate the gaps between the inactive pixels. In some cases where the non-empty block includes a large number of both active and non-active pixels, the description may simply indicate the raw pixel data. In some embodiments, when the transmit buffer experiences an overflow due to resource limitations, the data compression unit will include a loss report in the output data stream. The loss report may describe which part(s) of the image could not be stored into the transmit buffer. In some embodiments, the data compression unit may be configured to use an adaptive encoding to encode the number of skipped empty blocks. The adaptive encoding may encode the skip distance using a Variable Length Code (VLC) whose width is determined according to the entropy of one or more most recent images.

As may be appreciated by those skilled in the art, the disclosed hybrid image compression techniques improve the functioning of current image processing systems and overcome a number of technical challenges faced by these systems. In one respect, the hybrid image compression technique may be used to provide on-the-fly lossless compression of sparse binary image data to enable usage of a low-bandwidth transmission channel between the sensor and downstream image processing unit(s). The on-the-fly lossless compression of image data reduces the amount of data transmitted over the communication channel and in turn, reduces the active-state time of the channel logic resources. In another respect, the hybrid compression technique allows the compression unit to choose the best block encoding method for individual blocks, so that the resulting data stream can be as small as possible. In another respect, the generated loss report provides vital information to the downstream image processor, enabling the processor to appropriately recover from data loss. In yet another respect, the adaptive encoding used by the compression unit enables the compression encoding to adapt to the changing characteristics of the transmitted images over time, which further reduces the size of the resulting data stream. The adaptive encoding feature is particularly useful in video data applications, where sequences of captured video frames share image characteristics that can evolve slowly over time or depending on the observed scene. These and other features and benefits of the disclosed image compression techniques are discussed in further detail below, in connection with the figures.

FIG. 1 is a block diagram illustrating components of an example image processing system configured to compress captured images for transmission over a communication channel, according to some embodiments.

In some embodiments, the system depicted in FIG. 1 may be implemented as one or more devices, which may include logic resources (e.g. a collection of hardware circuits) and/or one or more processors (e.g. CPUs for executing software code). In some embodiments, the image sensor 110 may be a camera (e.g. a video camera) that is configured to capture image data continuously. In some embodiments, the camera may be an event camera configured to detect changes in an observed scene. In some embodiments, the image sensor 110 and image processor 160 may be implemented as two separate devices (e.g. a camera and a separate computer). In some embodiments, the components shown in the figure may be implemented in a single device (e.g. a smartphone, a headset, a vehicle, etc.) and may be located on the same circuit board.

In some embodiments, the captured images may be binary images where each pixel can have one of two values (e.g. 0 or 1 indicating active or inactive). In some embodiments, a captured image may be decomposed into multiple binary images (e.g. indicating different types of binary properties). As shown, image may initially be captured via an image sensor array 120, which may be implemented by a photosensor of a camera. In some embodiments, the image sensor 110 may implement readout logic 124 configured to read out the state of the image sensor array and serialize the information into binary data of the image 122. Where the image is a binary image, each bit in the image data will represent an individual pixel (e.g. whether the pixel is active or inactive). In some embodiments, each active pixel in the binary image may indicate a brightness change detected in the observed scene. In some embodiments, the binary image may be a sparse image where most of the pixels are inactive (or active).

As shown, embodiments of the image sensor 110 may implement a hybrid image compressor 130, which will perform the hybrid image compression techniques disclosed herein. In some embodiments, the hybrid image compressor 130 may be integrated into a data transmit interface of the image sensor 110. In some embodiments, the hybrid image compressor 130 will convert the binary data of the image into a compressed data stream 132 to be transmitted over the communication channel 150. As shown, in some embodiments, the compressed data stream 132 may be temporarily stored in a transmit buffer 140. The contents of the transmit buffer will be read by the data transmitter 142 (e.g. a physical layer transmission device) and sent over the communication channel 150. Depending on the embodiment, the communication channel 150 may be implemented by a variety of physical transmission media. In some embodiments, the image sensor 110 and image processor 160 may be implemented on the same circuit board, and the communication channel 150 may be a data bus that connects the two components. In other embodiments, the communication channel 150 may be some other type of channel such as a data cable or a network link (e.g. a wireless link).

In some embodiments, the image sensor 110 will periodically place the data transmitter 142 in an inactive state (e.g. unpowered or low-power mode) in order to save power. For example, in some embodiments, the image sensor will transmit image data in bursts, whenever the contents of the transmit buffer reaches a certain capacity. The data transmitter may be powered off when the transmit buffer is below the capacity threshold, and powered on or activated when the capacity threshold is exceeded. Thus, by compressing the image data as described, the image sensor will be able to keep the data transmitter in the inactive state for longer periods of time. In some embodiments, the image sensor will capture an incoming image stream at a speed of 10 Gbits per second and transmit a compressed data stream at an average speed 1 to 100 Mbits per second. This difference between the incoming and outgoing data rates means that the data transmitter can remain inactive for a substantial proportion of the time that the image sensor is operating.

As shown, the image processor 160 in this example implements a data receiver 170 to receive the compressed data stream 132 over the communication channel 150. Data received via the data receiver 170 may be stored temporarily in a receive buffer 172. In some embodiments, the data will be stored in a form so that it will be recognized by a hybrid image decompressor 180 as the compressed data stream 174. The hybrid image decompressor will act as the counterpart to the hybrid image compressor 130 to recreate the image 182 from the compressed data stream 174. As discussed, in some embodiments, the hybrid image decompressor 180 is able to recreate the image 182 without any loss of information. Accordingly, use of the hybrid image compression techniques described herein permits lossless transmission of image data over the communication channel. As shown in this example, the recreated image 182 is provided to the image process unit 190 to be processed. The image processing unit 190 may perform a variety of image process tasks depending on the application. In some embodiments, the image sensor 110 may be a video camera that is configured to capture and send a continuous sequence of images, and the image processing unit 190 is configured to process the continuous sequence of images in real time. In some embodiments, the image sensor 110 is part of an event camera that sends binary images indicating change events in an observed scene, and the image processor is programmed to take action based on the detected changes in the scene.

Figure 2:
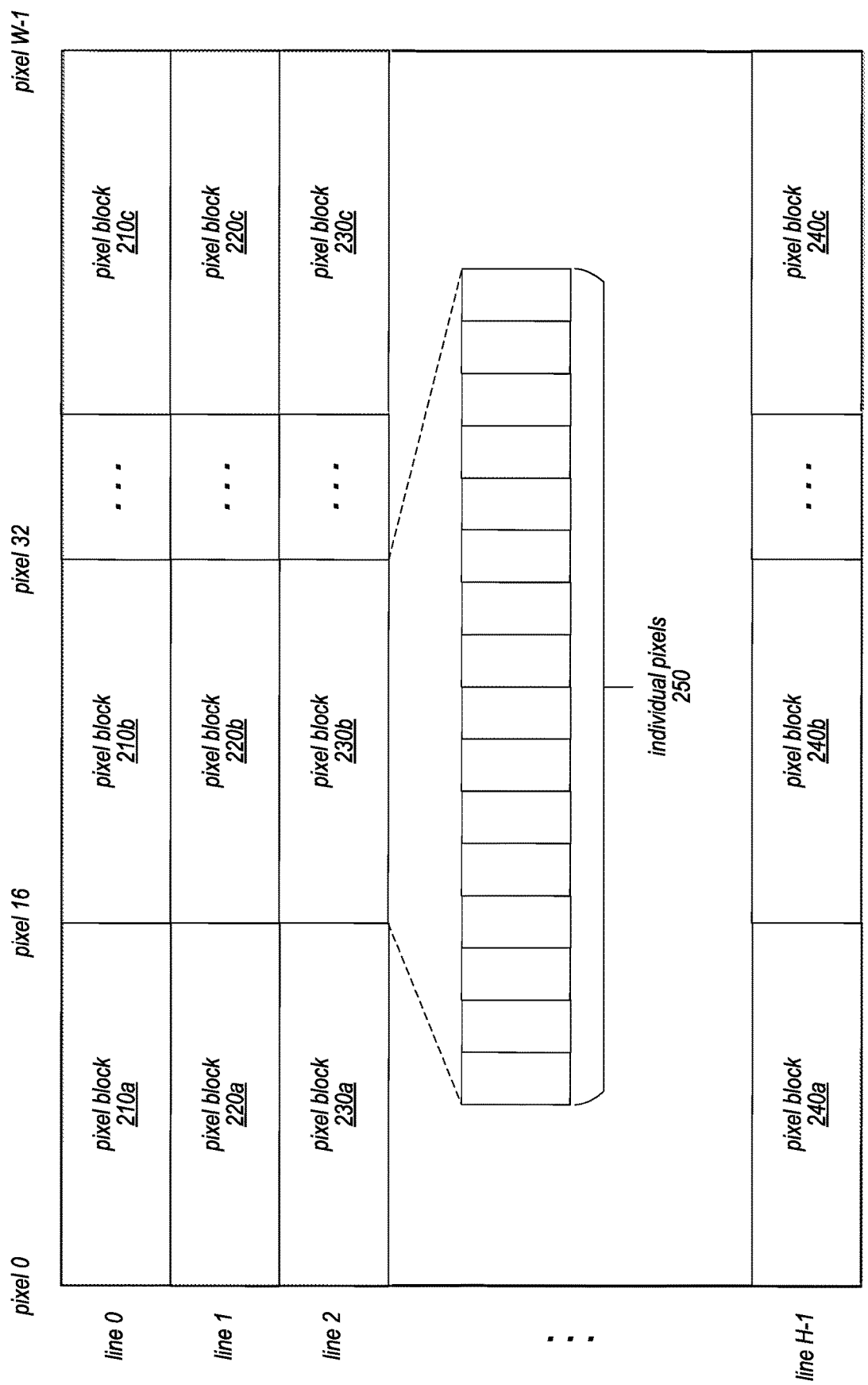
FIG. 2 illustrates an example block partitioning of an image to be compressed using a hybrid compression technique, according to some embodiments.

FIG. 2 illustrates an example block partitioning of an image to be compressed by a hybrid compression technique, according to some embodiments.

As shown, in some embodiments, each image to be compressed by the hybrid compression technique may first be partitioned into a number of pixel blocks. Depending on the embodiment, this partitioning may be performed by the hybrid image compressor 130 or the readout logic 124 of FIG. 1.

As shown in this example, the image pixels are organized in a two-dimensional grid, which may reflect how the data is organized by the image sensor array 120. In this example, the grid contains H lines (lines 0 to H−1), and each line contains W pixels (pixels 0 to W−1). In this example, the partitioning is performed in a one-dimensional manner, where the grid of pixels is read line-by-line, and each line is divided into a fixed number of consecutive pixels based on specified pixel offsets. In this example, each pixel block 210$a$-$c$, 220$a$-$c$, 230$a$-$c$, or 240$a$-$c$ contains a group 250 of 16 pixels.

In other embodiments, a different partitioning scheme may be used. For example, in some embodiments, a two-dimensional partition scheme may be used where a contiguous group of N-by-M pixels (e.g. 4-by-4 block) is collected for each block. In this partitioning scheme, N represents the number of consecutive pixels in a line, while M represents a number of consecutive lines. In some embodiments, the partitioning process may be performed in the order in which the pixel data is provided to the hybrid image compressor by the readout logic.

Figure 3:
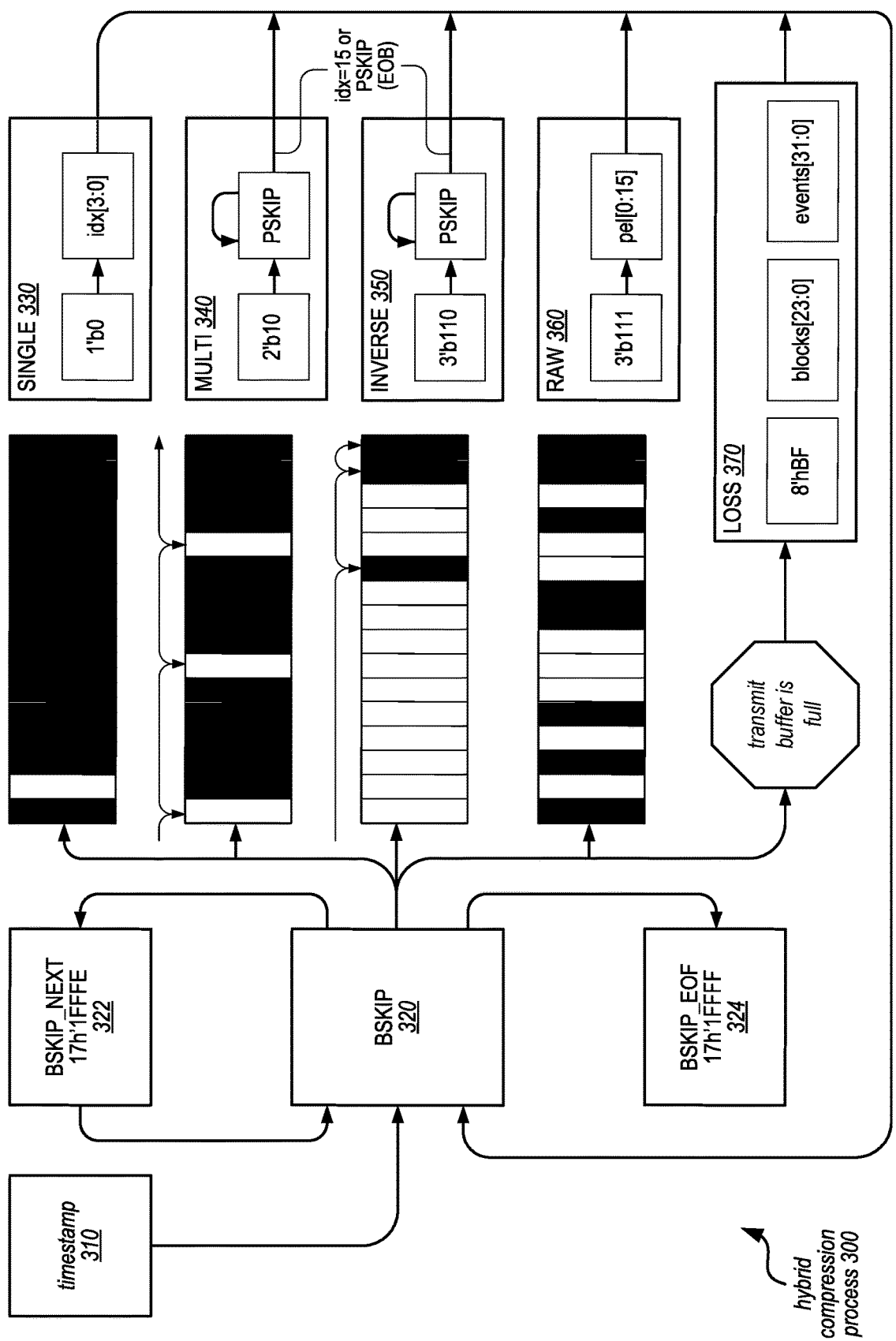
FIG. 3 illustrates an example process of compressing an image by a hybrid image compression technique, according to some embodiments.

FIG. 3 illustrates an example process of compressing an image using a hybrid image compression technique, according to some embodiments. The depicted process 300 may be implemented by an embodiment of the hybrid image compressor 130 of FIG. 1.

As shown, in some embodiments, each image is associated with a timestamp 310. In some embodiments, the timestamp 310 may indicate a time that the image was captured, and will uniquely identify the image within a sequence of video frames captured by a video camera. In some embodiments, this timestamp may be generated by the image compressor 130. In some embodiments, the timestamp may be included in the image header, along with other information about the image. The frame header may be written as a first element into the compressed data stream.

As discussed, in some embodiments, the hybrid image compression may be specially optimized to compress sparse binary images. In such images, most of the pixel blocks will contain no active pixels. In some embodiments, an active pixel may be seen as "white," while inactive pixels may be seen as "black." Blocks without any active pixel are considered empty. During the compression process, sequences of empty blocks may be represented using a BSKIP counter 320, as shown, which describes the number of empty blocks (e.g. in raster-scan order), before the next non-empty block is encountered. Thus, in some embodiments, the compressed data stream will contain individual BSKIP counters 320 followed by individual block encodings for a non-empty block (e.g. block encodings 330, 340, 350, or 360). In some embodiments, the BKIP counter 320 may indicate a value of 0 if consecutive non-empty blocks are encountered.

In some embodiments, values of the BSKIP counter 320 are encoded using a variable number of bits. This form of variable length code (VLC) is used because the image sensor may capture images of a wide range of scenes, each with distinct probability of occurrences of skipped distances. As a result, the bit width assigned to a certain VLC code may be inefficient (e.g. too long for frequent codes or too short for infrequent codes). For example, a scene that is brighter than the average image produces more active pixels and less empty blocks. As a result, shorter gaps will occur more often, and these shorter gap values should be encoded with less bits. Ideally, the bit width of a particular count value should correspond inversely to the probability of its occurrence, according to the formula below. By adhering to the formula, more commonly seen skip distance values (e.g. smaller distances) are encoded using a smaller number of bits, so that the size of the data stream is kept as small as possible.

bits=1/log$_2$ probability of value

In some embodiments, the probability value of different skip distances may be tracked based on recently captured images. The number of bits may be calculated based on the observed probability of the values rounded to the nearest integer. The result can be used to construct a Variable Length Code (VLC) table (example shown below in Table A) that maps a range of skip distance values to a set of codes.

TABLE A

| BSKIP counter value codes | |
|---|---|
| Counter Value | BSKIP Code |
| 0 | 2'b00 |
| 1 | 2'b01 |
| 2 (2 + 0) | 4'b1000 |
| 8 (2 + 6) | 4'b1110 |
| 9 (9 + 0) | 4'hF 8'b11111110 |
| 263 (9 + 0xFE) | 4'hF 8'b11111110 |
| 264 (264 + 0) | 12'hFFF 20'h00000 |
| 1,048,836 (264 + 0xFFFFC) | 12'hFFF 20'hFFFFC |
| Escape code D | 12'hFFF 20'hFFFFD |
| Escape code E | 12'hFFF 20'hFFFFE |
| Escape code F | 12'hFFF 20'hFFFFF |

As shown in Table A, this set of codes allows for representation of distances from 0 to over 1 million blocks (e.g. an image resolution of 4096×4096 pixels). Note that the codes are organized in tiers, where a first tier of very common values (0 and 1) are represented using only 2 bits, a second tier of less common values (2 to 8) are represented using 4 bits, a third tier of even less common values (9 to 263) are represented using 12 bits, and a final tier of least common values are represented using 32 bits. The VLC thus maps commonly encountered skip distance values to short codes, while at the same time allows uncommon skip distances to be encoded. The threshold value for these tiers (e.g. 2, 9, 264) may be determined empirically based on a statistical analysis of previous images. In some embodiments, the VLC range may be extended by using an escape code (e.g. escape code D or E). The escape code may be used to indicate that an ensuing number of bits are used to encode additional counter values (e.g. an additional BSKIP counter to encode another 1,048,836 distance values).

As shown in the above example, the BSKIP codes are implemented as a prefix code (or prefix-free code), where no code in the code set is a prefix of another code in the code set. This may be implemented by prepending a different prefix for each tier of codes. In the above example, the prefix is 0 for the first tier, 1 for the second tier, 0xF for the third tier, and 0xFFF for the fourth tier. By using a prefix code, the compression may be performed without the use of out-of-band or special word markers. Moreover, the prefix code means that the decoder does not have to maintain any backward-looking state. The decoder can decode the entire compressed image using a single forward scan.

As shown, in some embodiments, certain values in the code set may be reserved for special characters (e.g. escape codes E, D, and F). In this example, escape code E is used to represent a special BSKIP value (code 322 in FIG. 3) that indicates the next value in the data stream is another BSKIP value. This special BSKIP value may be used if the skip distance is greater than the maximum value permitted by the code set (here 1,048,836). In this example, escape code F is used to denote an "end of file" or EOF symbol (code 324 in FIG. 3), which indicates the end of the compressed data stream.

In some embodiments, if the statistical analysis indicates that a change of the VLC is warranted (e.g. when the distribution of block skip distances changes significantly), a new VLC for the BSKIP counters will be calculated. The new code set may be defined using a number of control parameters, which are programmed into a programmable VLC table (example shown in Table B below). In some embodiments, this programmable table may be implemented using a programmable logic device such as a FPGA. In some embodiments, this VLC table may be shared between the compressor and the decompressor, so that they can both use the same set of codes to determine BSKIP counter values. In this manner, the image compression unit can continuously adapt the changing characteristics of the captured images, so that the VLC is the most compact code set for the observed image characteristics.

TABLE B

Programmable parameters for calculating BSKIP codes

| Value Threshold | Prefix | Code Size |
|---|---|---|
| 0 | 0 | 2 bits |
| 2 | 1 | 4 bits |
| 9 | 0xF | 12 bits |
| 264 | 0xFFF | 32 bits |
| 1,048,837 | N/A | N/A |

To compute a VLC code from a BSKIP counter value using Table B, the following steps may be used. First, the table is searched for a threshold value (first column) that is smaller than or equal to the distance value to be encoded. In some embodiments, the logic may also perform a sanity check to make sure that the next threshold value is larger than the distance value. This step determines the tier of the VLC code set for the value. Second, the threshold for the tier is subtracted from the value, and the prefix associated with the tier is added to the value. Third, the resulting value is outputted as a bit string of the code size of that tier.

In this example, the values in Table B can be used to generate the BSKIP codes shown in Table A. To encode the value 6, a tier is first determined from the table (here the second row in the Table B). The threshold of 2 is subtracted from the value, obtaining a value of 4 (0010 in a bit string of size 4). The prefix of 1 is added to the bit string, resulting in "1010" as the encoded value of 6. In this manner, a programmable VLC table such as Table B can be used to describe a wide variety of potential code sets using only a few control coefficients.

As shown in FIG. 3, in addition to the BSKIP counters 320, the compressed data stream may also include different types of block encodings 330, 340, 350, and 360 for different types of non-empty blocks. In some embodiments, every individual block with active pixels is encoded using one of these block encoding (e.g., the shortest encoding is for each block). The encoding scheme or technique for each block may be selected based on the contents of the block (e.g. how many active pixels are in the block and where they are located). In some embodiments, a block may be encoded using all encoding methods, and the shortest resulting block encoding will be used in the data stream.

As shown, in each block encoding scheme, the first bits of the coded block indicate the block encoding type. In some embodiments, the number of bits used to encode the block encoding type is also a type of VLC whose length vary based on observed probability of the different block types.

In some embodiments, the block encoding 330 for blocks with a single active pixel starts with a value of 0, as shown for block encoding 330 in FIG. 3. This type of block is typically the most common block type after empty blocks. Accordingly, this block encoding type is encoded using a single bit. The block encoding 330 will then include the index of the active pixel within the block. For example, if the sixth pixel of a 16-pixel block is active, the block is encoded as the 5-bit value "0-0110," where the first bit is the block encoding type code and the next four bits represent the number 6 in binary.

As shown, another type of block encoding 340 is used for some blocks that have more than one active pixel. This block encoding type is encoded with a 2-bit block encoding type code ("10" in this example). The 2-bit block encoding type code is followed by a sequence of pixel-skip (PSKIP) counters. In some embodiments, the PSKIP counters are also encoded using a variable length code. Because shorter pixel skip distances are generally more common than longer pixel skip distances, this VLC uses shorter codes for smaller PSKIP distances. Table C below illustrates one example of PSKIP distance encodings for the embodiment shown in FIG. 3. In some embodiments, the coding scheme for the PSKIP counter values will not change based on observed images as with the BSKIP values, because the probabilities of these values are not likely to change from image to image.

TABLE C

PSKIP counter value codes

| Counter Value | PSKIP Code |
|---|---|
| 0 | 1'b0 |
| 1 | 3'b100 |
| 2 | 3'b101 |
| 3 | 3'b110 |
| 4 | 5'b11100 |
| 5 | 5'b11101 |
| 6+ | 5'b11110 |
| END | 5'b11111 |

In some embodiments, if the PSKIP value exceeds 6, another PSKIP code may be added to indicate the remainder of the PSKIP distance. As shown, the last PSKIP value in the block encoding 340 will indicate the index 15, or the "EOF" code for the block encoding, which is the bit string "11111" in this example.

As an example, in order to encode a pixel block having the contents "0010-1100-0000-0000," the hybrid image compressor will first translate the block into the PSKIP counter sequence "2-1-0-END," which indicates sequences of two zeros, one zero, and no zeroes in the block. This PSKIP counter sequence is then translated into the compressed bit stream sequence "10-101-100-0-11111" based on Table C. The block encoding ends when either an END code is generated or after all the bits in the pixel are described.

As shown, another type of block encoding 350 is used for some blocks that have more active pixels than inactive pixels. In order to achieve good compression with this block type, the pixels are first inverted and then encoded, resulting in an encoding of gaps between the inactive pixels in the block. As shown, this block type, which is less common, is encoded with the 3-bit block encoding type code "110." The rest of the encoding is a sequence of PSKIP counters, similar to the block encoding 340. In some embodiments, the PSKIP counters for this block encoding type will use the same VLC as block encoding 340 (e.g. the codes in Table C above).

As an example, in order to encode a pixel block having the contents "1110-1111-1011-1111," the pixel block is first inverted to produce "0001-0000-0100-0000." The inverted block is then translated into the PSKIP counter sequence "3-5-END." This PSKIP counter sequence is then encoded into the compressed bit stream sequence "110-110-11101-11111," according to Table C above.

In some cases, both the MULTI 340 and INVERSE 350 block encodings can be excessively large. Thus, to limit the worst-case size of a block encoding, the hybrid image compressor may implement a fourth type of block encoding 360, which provides the pixels in the block in raw format. As shown in FIG. 3, the block encoding type code for this type of encoding is the 3-bit value "111." As an example, a pixel block having the contents "0101-0101-0101-0101" would result in a 2+24 bit MULTI encoding and a 3+24 bit INVERSE encoding. On the other hand, the raw encoding 360 of the block is "111-0101-0101-0101-0101," which is only 19 bits. In this situation, the shorter raw block encoding is used for the block. In some embodiments, the raw block encoding 360 reduces the hardware requirements of the image compressor, which can be very large for the worst case.

Finally, as shown, in some embodiments, the hybrid image compressor may include a loss report 370 in the compressed data stream. In some embodiments, due to the limits of the hardware, it is possible that the bandwidth of the transmission channel is exceeded despite the compression. Short episodes of high bandwidth can be managed by proper dimensioning of the transmit buffer. However, if the high bandwidth condition persists for an extended period of time, the transmit buffer will overflow. When this occurs, it is important to describe the lost image region(s) properly so that the receiver will know which part of the image is usable and take appropriate recovery actions. Accordingly, in some embodiments, the hybrid image compressor will inject a loss report 370, which may contain one or more of the following pieces of information:

- a header marking for the report (e.g. "10111111", which may be a MULTI-END special sequence encoded as a SKIP block);
- the number of blocks in the image that were lost; and
- optionally, additional information about the lost region (e.g., number of lost active pixels).

The loss report will allow the receiver of the image data stream (e.g. image processor 160 of FIG. 1) to take appropriate recovery actions. Such recovery actions may include ignoring or discarding the image or processing the image in a low-confidence mode. In some embodiments, the image processor may determine that the lost portion of the image lies outside of an area of interest, so that the image can still be used despite the data loss.

In some embodiments, the receiver of the compressed data stream (e.g. the image processor 160 of FIG. 1) will use the reverse process to decompress the data stream into the original image. Note that under normal circumstances, the reconstructed image will be identical to the original image captured by the sensor, because no information is lost during the image compression process.

Using the disclosed hybrid image compression techniques, the size of sparse binary images can be significantly reduced. Accordingly, the communication channel used to transmit the images can be designed with lower bandwidth requirements. Of course, the choice of channel bandwidth may depend on various application-specific factors and the delicate balance between different considerations such as low power consumption and the worst-case image compression ratio. Nonetheless, the disclosed hybrid image compression techniques provide a practical tool to enable substantial savings in power and hardware resources in the design of image processing systems.

Figure 4:
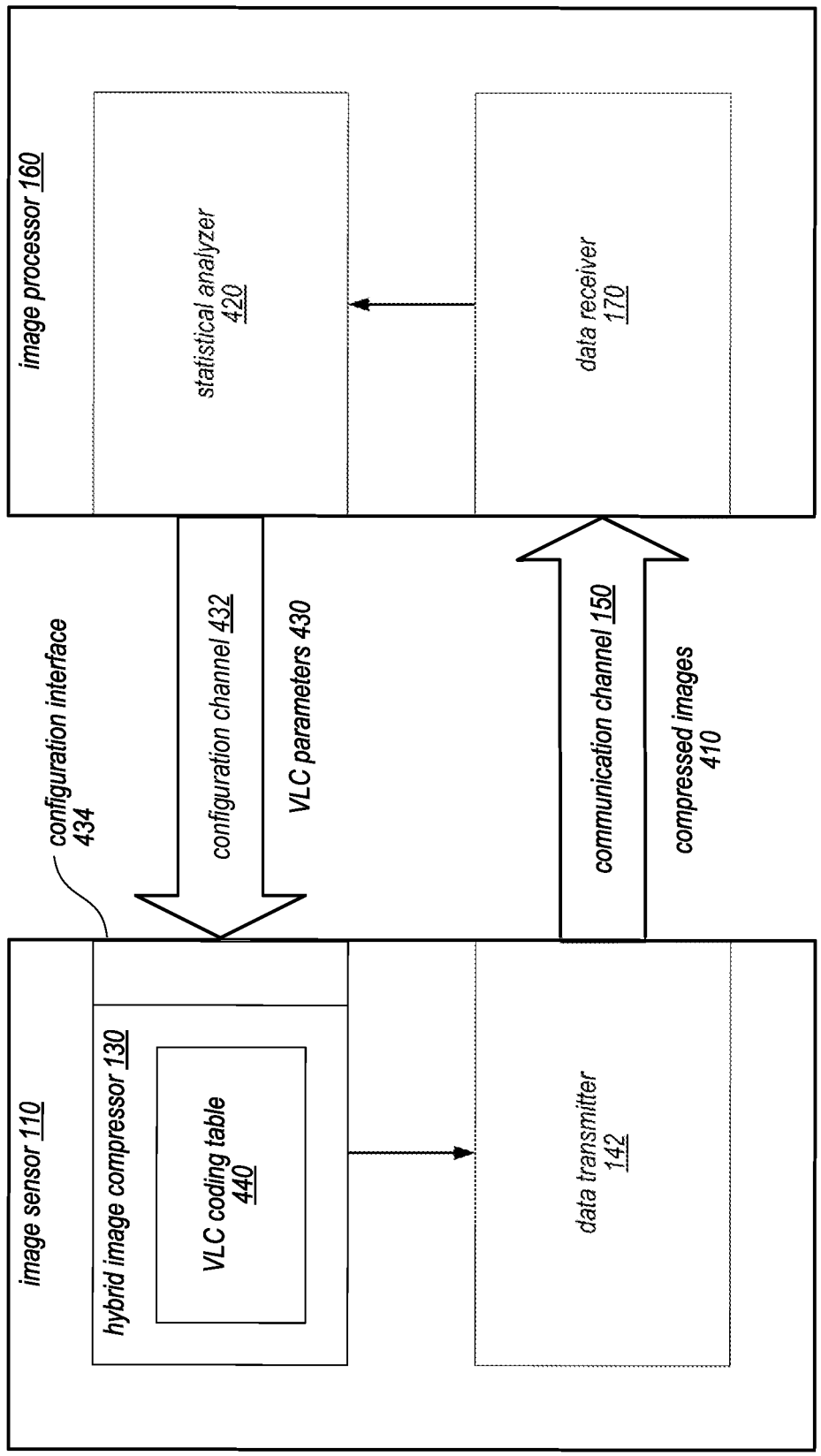
FIG. 4 illustrates an example embodiment of an image processing system used to automatically optimize parameters of a variable length code used by a hybrid image compressor, according to some embodiments.

FIG. 4 illustrates an example embodiment of an image processing system used to automatically optimize parameters of a variable length code used by a hybrid image compressor, according to some embodiments.

As shown, the figure depicts an embodiment of the image sensor 110 and image processor 160, as discussed in connection with FIG. 1. The image sensor 110 is configured to transmit a continuous sequence of compressed images 410 to the image processor 160.

As shown, the images are then provided to a statistical analyzer component 420. The statistical analyzer 420 will perform statistical analysis on the received images over time to determine whether the VLC parameters 430 of the VLC used by the hybrid image compressor 130 should be changed. In some embodiments, the statistical analyzer 420 may be implemented by the image processing unit 190 of FIG. 1. If an adjustment of the parameters is warranted, the new VLC parameters 430 may be transmitted to the image sensor over a configuration channel 432, which may be a hardware communication medium (e.g. a data bus) similar to the communication channel 150. The configuration channel 432 may terminate at a configuration interface 434 of the image sensor 110. Once the VLC parameters 430 are received by the image sensor 110, these parameters may be stored in a programmable VLC coding table 440, which will be used to control how values are converted into code values in the VLC. An example VLC coding table for encoding BSKIP values is shown in Table B above.

Depending on the embodiment, the statistical analyzer 420 may be implemented in another component of the system. For example, in some embodiments, the statistical analyzer may be implemented on the sending side, as part of the image sensor (e.g. in between the readout logic 132 and the image compressor 130, or between image compressor 130 and transmit buffer 140). In some embodiments, the statistical analyzer may be implemented separately from both the image sensor and the image processor. In such embodiments, when the VLC coding table 440 is changed, its contents may be transmitted to the image processor 160 to update a corresponding coding table on the receiving side used for decoding purposes.

Depending on the embodiment, the statistical analyzer 420 may employ a variety of methods to determine VLC parameters 430. In some embodiments, the analyzer 420 will examine a recent window of received images to determine the distribution of values in the images (e.g. the SKIP distances) to be encoded by the VLC. The analyzer may then determine the tier thresholds of the VLC based on preconfigured quantiles of the distribution. For example, the analyzer may determine that a range of values that represent 80% of the observed values will be encoded by a first tier of VLC codes, a next range of values that represent the next 15% of the observed values will be encoded by second tier of VLC codes, and so on.

In some embodiments, the statistical analyzer will periodically generate VLC parameter changes 430 (e.g. once every 1000 frames), so that the image compressor 130 will continuously adapt to the changing characteristics of the observed images. In other embodiments, the configuration process may only be transmitted for a short tuning phase, for example, when the image sensor is first installed to monitor a static scene. In some embodiments, the auto-configuration of the image sensor may be enabled or disabled manually via user interface controls.

Figure 5:
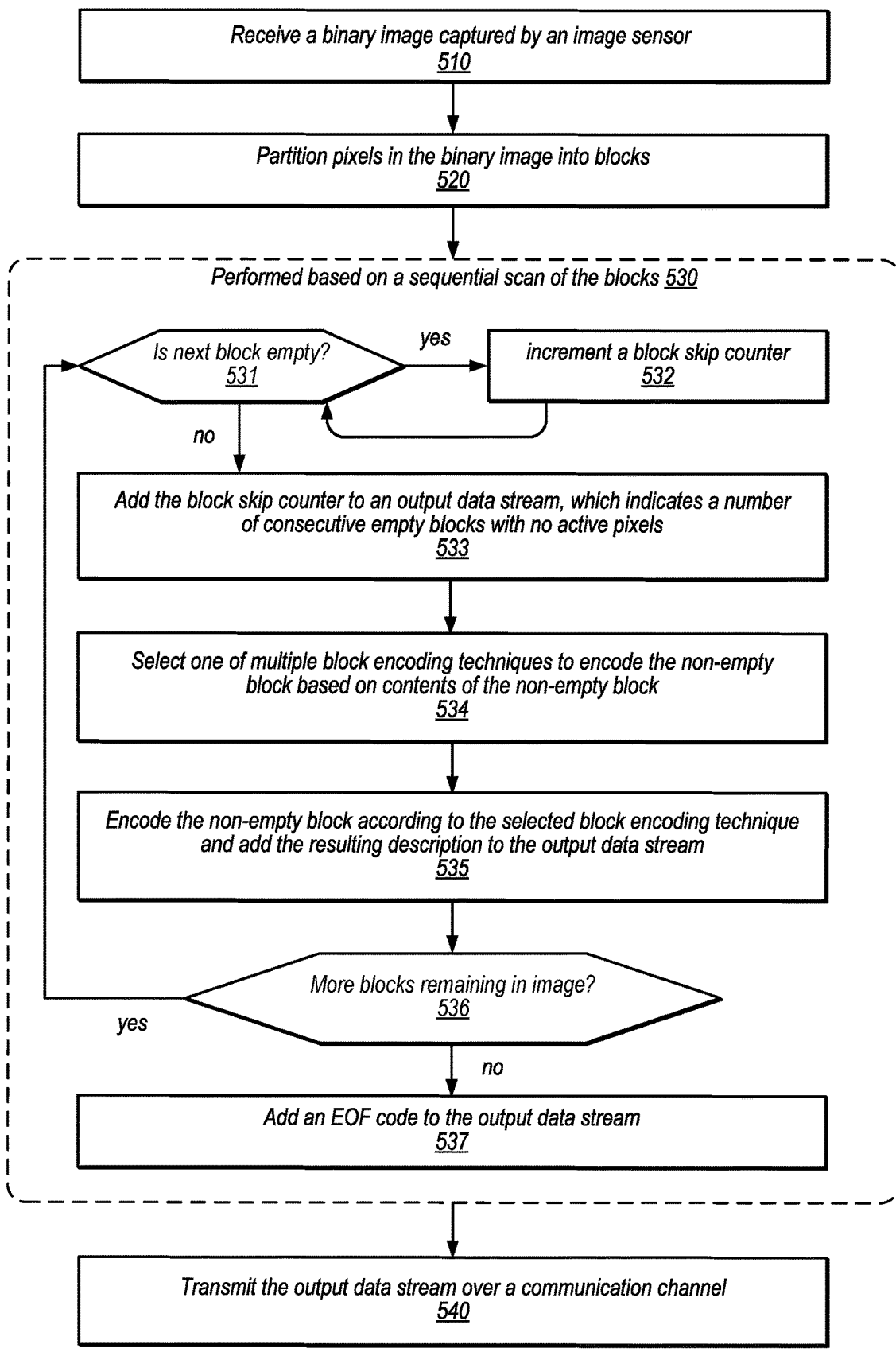
FIG. 5 is a flow chart illustrating an example process of compressing an image using a hybrid compression technique, according to some embodiments.

FIG. 5 is a flow chart illustrating an example process of compressing an image using a hybrid compression technique, according to some embodiments. Portions of the process depicted in the figure may be performed by an embodiment of the hybrid image compressor 130, as discussed in connection with FIG. 1.

At operation 510, a binary image is received. The binary image (e.g. image 122 of FIG. 1) may be captured by a camera and provided by a readout logic (e.g. readout logic 124) associated with the camera. The binary image may include binary values (e.g. indicating active or inactive) for a grid of pixels of the image. In some embodiments, the binary image may be sparse, where most of the pixels in the image are inactive (or active).

At operation 520, the pixels in the binary image are partitioned into blocks. In some embodiments, operation 520 may be performed in a similar manner as discussed in connection with FIG. 2. For example, the partitioning may divide each line of the pixel grid into a number of equal-size blocks in a one-dimensional partitioning approach. As another example, the partitioning may generate N-by-M blocks of pixels that span multiple consecutive lines, in a two-dimensional partitioning approach.

As shown, in this example, operations 531 to 537 are performed 530 based on a sequential scan of the blocks. At operations 531 and 532, a block skip counter (e.g. BSKIP 320 of FIG. 3) is created. As shown, the process will check each block to see if it is empty (operation 531), and if so, increment the block skip counter (operation 532). Once a non-empty block is encountered, the block skip counter value is added to an output stream that is the result of the image compression (operation 533). Accordingly, the BSKIP counter will indicate the number of consecutive empty blocks in a sequence seen in the image. In some cases, the BSKIP counter value may be zero. In some embodiments, the BSKIP counter value may be encoded in a variable length code, where the code values for different counter values have different bit widths, as discussed in connection with FIG. 4. In some embodiments, more commonly observed counter values (e.g. smaller count values) are encoded with smaller codes in order to reduce the size of the compressed image. In some embodiments, the variable length code may be a prefix code where no code value is a prefix of another code value in the code set. In some embodiments, the variable length code may be changed from time to time, based on a statistical analysis of the distribution of skip counter values in recently received images. In some embodiments, if the skip counter value is too large for the variable length code, multiple additional skip counter value(s) may be added to the data stream until the skip distance is fully described.

At operation 534, the hybrid image compressor selects one of multiple block encoding techniques to encode a next non-empty block in the image. In some embodiments, this selection may be performed based on the contents or characteristics of the non-empty block. In some embodiments, the compressor may simply encode the block using all available block encoding methods and select the shortest resulting encoding. In some embodiments, the different types of block encodings may include block encodings 330, 340, 350, and/or 360 as discussed in connection with FIG. 3. In some embodiments, each block encoding may begin with a block encoding type code that indicates the type of block encoding that was used. In some embodiments, the block encoding type code may be a variable length code whose code length is assigned based on the historical frequency of the type of block encoding.

At operation 535, the non-empty block is encoded according to the selected block encoding technique, and the resulting block encoding is added to the output data stream. In some embodiments, the output data stream may be written to a temporary storage area such as the transmit buffer 140 of FIG. 1 to await transmission over a communication channel.

At operation 536, a determination is made whether additional blocks remain in the image. If so, the process loops back to operation 531 where another block skip counter will be generated. The process will thus continue down the sequence of blocks until all blocks have been encoded by the compression process. If there are no more block remaining in the image, the process proceeds to operation 537, where the image compressor generates an EOF code (e.g. EOF code 324 of FIG. 3) in the output data stream to indicate to the decompressor that there are no further blocks in the image.

At operation 540, the output data stream is transmitted over a communication channel (e.g. the low-bandwidth channel 150 of FIG. 1). In some embodiments, the channel may connect the image sensor to an image processor that is configured to process images captured by the image sensor in real time. In some embodiments, the output data stream may be stored in a transmit buffer, which may serve as a temporary staging area for data to be transmitted over the transmission channel. In some embodiments, the transmission may occur asynchronously from the compression process. Advantageously, by using the hybrid image compression techniques disclosed herein, the binary image may be transmitted using less power and a lower bandwidth transmission channel.

Figure 6:
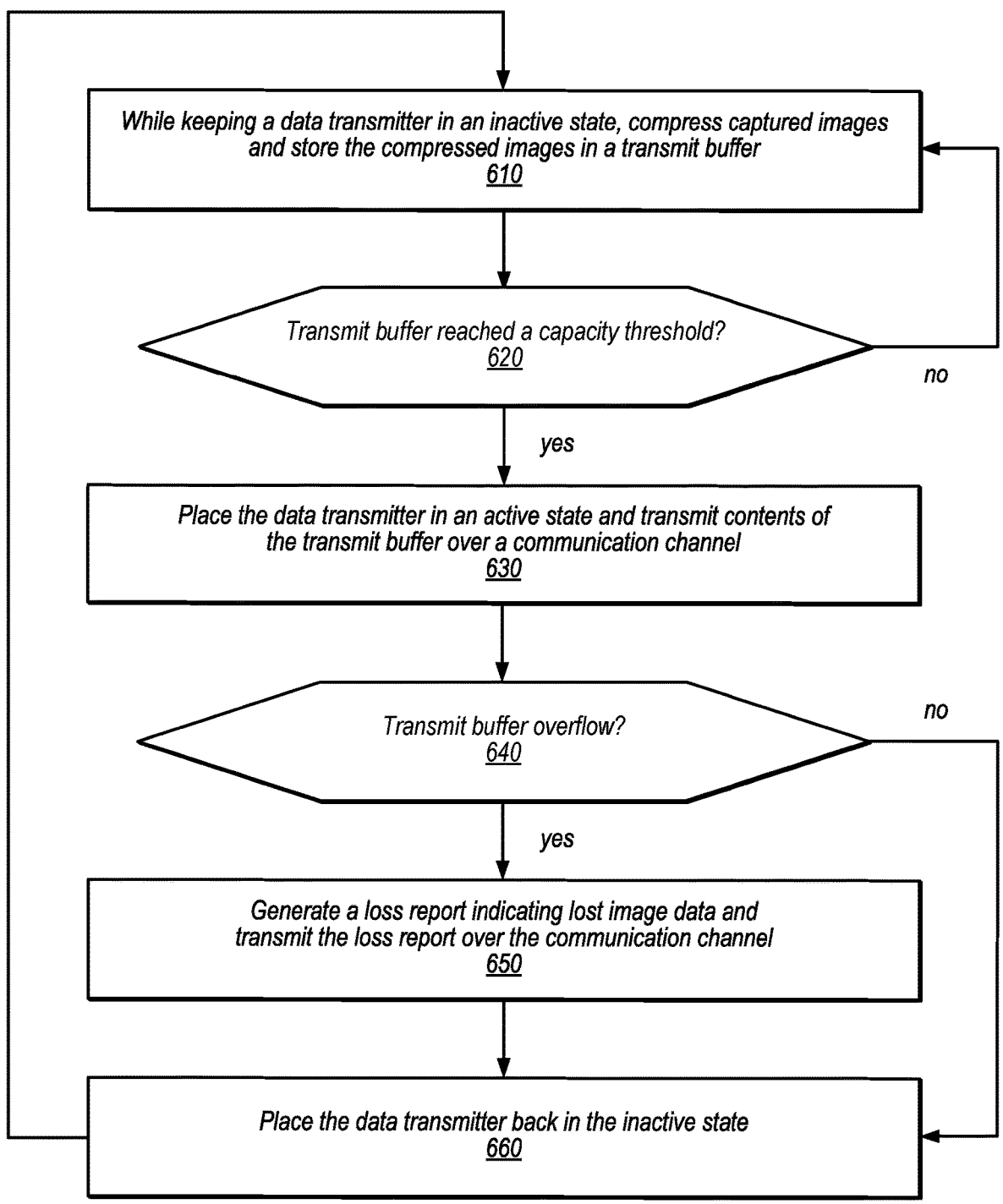
FIG. 6 is a flow chart illustrating an example process of transmitting an image compressed using a hybrid compression technique, according to some embodiments.

FIG. 6 is a flow chart illustrating an example process of transmitting an image compressed using a hybrid compression technique, according to some embodiments. The process depicted in the figure may be performed by an embodiment of the image sensor 110, as discussed in connection with FIG. 1.

At operation 610, captured images are compressed and stored in a transmit buffer while a data transmitter is kept in an inactive state. The images may be binary images (e.g. image 122 of FIG. 1), the transmit buffer may be the transmit buffer 140 of FIG. 1, and the data transmitter may be the data transmitter 142 of FIG. 1. In some embodiments, these components may all be implemented with an image sensor such as image sensor 110 of FIG. 1. In some embodiments, the compression process may be performed by a hybrid image compressor such as the image compressor 130 of FIG. 1, in a manner as discussed in connection with FIG. 5.

At operation 620, a determination is made whether the transmit buffer has reached a capacity threshold. In some embodiments, this determination may be implemented in hardware logic in the image sensor, which is configured to automatically change the operating state of the data transmitter in the image sensor. The capacity threshold may be a preset parameter (e.g. 75%) that controls when the data transmitter is allowed to transmit data. Higher values of the threshold will allow the data transmitter to remain inactive for longer periods of time, but increase the risk of buffer overflow. In some embodiments, the capacity threshold may be a configurable parameter that can be changed during the operation of the image sensor.

As shown, if the capacity threshold is not reached, the process loops back to operation 610 to continue storing captured images in the transmit buffer. If the capacity threshold is reached, the process proceeds to operation 630, where the data transmitter is placed in an active state. Once active, the data transmitter is then used to transmit the contents of the transmit buffer over a communication channel (e.g. communication channel 150 of FIG. 1).

At operation 640, a determination is made whether the transmit buffer is overflowed. In some embodiments, this determination may be made by hardware logic in the image sensor, which is configured to automatically trigger the generation of a data loss report.

If an overflow has occurred, at operation 650, a loss report is generated. In some embodiments, during a transmit buffer overflow, additional image data is simply discarded and not stored in the transmit buffer. The loss report (e.g. loss report 370 of FIG. 3) will indicate the extent of the lost image data (e.g. any lost blocks or pixels). In some embodiments, the loss report may indicate the number and position of the lost blocks or pixels, and/or the reasons for the data loss. The loss report is then transmitted over the communication channel along with the contents of the transmit buffer. The information contained in the loss report may be used by the receiver side component (e.g. the image processor 160 of FIG. 1) to determine a recovery mechanism for the lost data.

Finally, at operation 660, the data transmitter is placed back into the inactive state. The data transmitter will remain in the inactive state until the transmit buffer reaches the capacity threshold again. As may be understood, the described process may be used to maintain the data transmitter in an inactive state for periods of time in order to save power. In some embodiments, power usage of the image sensor is dominated by data transmissions over the communication channel. As a result, the amount of power savings achieved using the described process can be quite significant.

Figure 7:
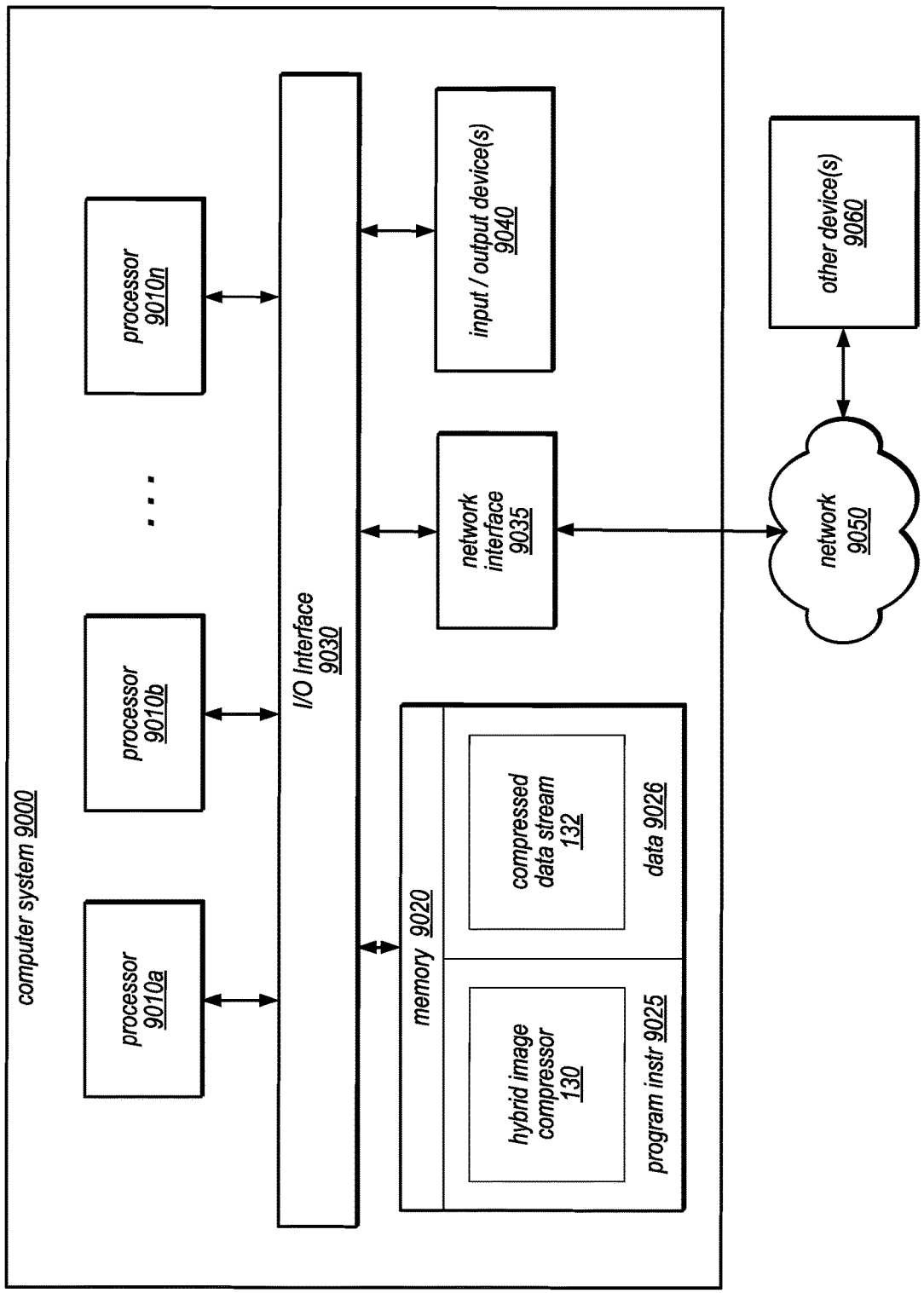
FIG. 7 illustrates an example computing system that may be used to implement one or more portions of an image processing system that uses a hybrid image compression technique, according to some embodiments.

FIG. 7 illustrates an example computing system that may be used to implement one or more portions of an image processing system that uses a hybrid image compression technique, according to some embodiments. As shown in this example, an embodiment of the hybrid image compressor 130 is implemented in software, which is executed on a computer system 9000.

In the illustrated embodiment, computing device 9000 includes one or more processors 9010 coupled to a main memory 9020 (which may comprise both non-volatile and volatile memory modules, and may also be referred to as system memory) via an input/output (I/O) interface 9030. Computing device 9000 further includes a network interface 9035 coupled to I/O interface 9040, as well as additional I/O devices which may include sensors of various types (e.g. the image sensor 110 of FIG. 1).

In various embodiments, computing device 9000 may be a uniprocessor system including one or more processors 9010a, 9010b, 9010n, etc., which may be implemented as a multiprocessor system. Processors 9010 may be any suitable processors capable of executing instructions. For example, in various embodiments, processors 9010 may be general-purpose or embedded processors implementing any of a variety of instruction set architectures (ISAs), such as the x86, PowerPC, SPARC, or MIPS ISAs, or any other suitable ISA. In multiprocessor systems, each of processors 9010 may commonly, but not necessarily, implement the same ISA. In some implementations, graphics processing units (GPUS) may be used instead of, or in addition to, conventional processors.

Memory 9020 may be configured to store instructions and data accessible by processor(s) 9010. In at least some embodiments, the memory 9020 may comprise both volatile and non-volatile portions; in other embodiments, only volatile memory may be used. In various embodiments, the volatile portion of system memory 9020 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (Re-RAM), three-dimensional NAND technologies, Ferroelectric RAM, magnetoresistive RAM (MRAM), or any of various types of phase change memory (PCM) may be used at least for the non-volatile portion of system memory. In the illustrated embodiment, program instructions 9025 and data 9026 implementing one or more desired functions, such as those methods, techniques, and data described above, are shown stored in different sections within main memory 9020. As shown in this example, the program instructions 9025 may be used to implement the hybrid image compressor 130 of FIG. 1, while the data 9026 may include the compressed data stream 132 generated by the compressor.

Network interface 9035 may be configured to allow data to be exchanged between computing device 9000 and other devices 9060 attached to a network or networks 9050, such as other computer systems or devices as illustrated in FIG. 1 through FIG. 4, for example. In various embodiments, network interface 9040 may support communication via any suitable wired or wireless general data networks, such as types of Ethernet network, for example. Additionally, network interface 9035 may support communication via telecommunications/telephony networks such as analog voice networks or digital fiber communications networks, via storage area networks such as Fibre Channel SANs, or via any other suitable type of network and/or protocol.

The various methods and/or techniques as illustrated in the figures and described herein represent exemplary embodiments of methods. The methods may be implemented in software, hardware, or a combination thereof. The order of method may be changed, and various elements may be added, reordered, combined, omitted, modified, etc. Various modifications and changes may be made as would be obvious to a person skilled in the art having the benefit of this disclosure. It is intended to embrace all such modifications and changes and, accordingly, the above description to be regarded in an illustrative rather than a restrictive sense.

While various systems and methods have been described herein with reference to, and in the context of, specific embodiments, it will be understood that these embodiments are illustrative and that the scope of the disclosure is not limited to these specific embodiments. Many variations, modifications, additions, and improvements are possible. For example, the blocks and logic units identified in the description are for understanding the described embodiments and not meant to limit the disclosure. Functionality may be separated or combined in blocks differently in various realizations of the systems and methods described herein or described with different terminology.

These embodiments are meant to be illustrative and not limiting. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the disclosure as defined in the claims that follow.

Although the embodiments above have been described in detail, numerous variations and modifications will become apparent once the above disclosure is fully appreciated. It is intended that the following claims be interpreted to embrace all such variations and modifications.

What is claimed is:

1. A system comprising:
an image sensor implemented by one or more logic devices, configured to:
capture a binary image;
perform a hybrid compression of the binary image to convert the binary image to a data stream, including to:
partition pixels in the binary image into a plurality of blocks;
determine a block in the binary image with at least one active pixel;
add an encoding of the block to the data stream, wherein the encoding is generated according to a block encoding technique selected based on contents of the block;
determine another block in the binary image with at least one active pixel; and
add another encoding of the other block to the data stream, wherein the other encoding is generated according to a different block encoding technique selected based on contents of the other block; and
store the data stream in a transmit buffer, wherein contents of the transmit buffer are transmitted over a communication channel.

2. The system of claim 1, wherein to perform the hybrid compression of the binary image, the image sensor is configured to:
determine a sequence of consecutive empty blocks in the binary image with no active pixels; and
add a block skip counter to the data stream that indicates a number of the consecutive empty blocks.

3. The system of claim 1, wherein:
the hybrid compression is performed by a hybrid image compressor implemented as part of the image sensor;
the data stream is transmitted to an image processor configured to process the binary image; and
the communication channel is a data bus that connects the image sensor to the image processor.

4. The system of claim 1, wherein:
the image sensor is implemented as part of an event camera; and
the binary image includes pixels that are activated based on brightness changes in a scene observed by the event camera.

5. The system of claim 1, wherein the image sensor includes a data transmitter, and the image sensor is configured to:
keep the data transmitter in an inactive state when contents of the transmit buffer is below a capacity threshold; and
switch the data transmitter to an active state to transmit the contents of the transmit buffer when the contents of the transmit buffer exceeds the capacity threshold.

6. The system of claim 1, wherein the hybrid compression is performed according to a lossless compression algorithm.

7. The system of claim 1, wherein the image sensor is configured to:
select one of a plurality of block encoding techniques to encode the block, wherein the selected block encoding technique produces a shortest encoding of the block among the plurality of block encoding techniques.

8. The system of claim 1, wherein:
the block includes a single active pixel; and
the encoding of the block includes an index of the active pixel within the block.

9. The system of claim 1, wherein:
the block includes a plurality of active pixels; and
the encoding of the block includes a pixel skip counter that indicates a number of consecutive inactive pixels in the block.

10. The system of claim 1, wherein:
the block includes a plurality of active pixels; and
the encoding of the block includes a pixel skip counter that indicates a number of consecutive active pixels in the block.

11. The system of claim 1, wherein:
the block includes a plurality of active pixels; and
the encoding of the block includes pixel values for all pixels in the block.

12. The system of claim 1, wherein the image sensor is configured to:
determine that a portion of the binary image cannot be stored in the transmit buffer due to an overflow of the transmit buffer; and
add a data loss report to the data stream, wherein the data loss report includes information about the portion of the binary image that cannot be stored in the transmit buffer.

13. The system of claim 2, wherein the image sensor is configured to:
encode the block skip counter according to a variable length code (VLC), wherein the VLC encodes counter values of the block skip counter using code values of different bit widths.

14. The system of claim 13, wherein:
the system comprises an image processor connected to the image sensor via the communication channel; and
the image processor is configured to:
perform a statistical analysis of binary images received from the image sensor; and
cause the image sensor to change the VLC based at least in part on the statistical analysis.

15. A method comprising:
capturing a binary image;
performing a hybrid compression of the binary image to convert the binary image to a data stream, including:
partitioning pixels in the binary image into a plurality of blocks;
determining a block in the binary image with at least one active pixel;
adding an encoding of the block to the data stream, wherein the encoding is generated according to a block encoding technique selected based on contents of the block;
determining another block in the binary image with at least one active pixel; and
adding another encoding of the other block to the data stream, wherein the other encoding is generated according to a different block encoding technique selected based on contents of the other block; and
storing the data stream in a transmit buffer, wherein contents of the transmit buffer are transmitted over a communication channel.

16. The method of claim 15, wherein performing the hybrid compression of the binary image comprises:
determining a sequence of consecutive empty blocks in the binary image with no active pixels; and
adding a block skip counter to the data stream that indicates a number of the consecutive empty blocks.

17. The method of claim 15, further comprising:
keeping a data transmitter in an inactive state when contents of the transmit buffer is below a capacity threshold; and
switching the data transmitter to an active state to transmit the contents of the transmit buffer when the contents of the transmit buffer exceeds the capacity threshold.

18. The method of claim 15, wherein:
the block includes a single active pixel; and
the encoding of the block includes an index of the active pixel within the block.

19. The method of claim 15, wherein:
the block includes a plurality of active pixels; and
the encoding of the block includes a pixel skip counter that indicates a number of consecutive inactive pixels in the block.

20. A non-transitory computer readable medium storing program instructions that when executed on a processor implements a hybrid image compressor and cause the hybrid image compressor to:
perform a hybrid compression of a binary image to convert the binary image to a data stream, including to:
partition pixels in the binary image into a plurality of blocks;
determine a block in the binary image with at least one active pixel;
add an encoding of the block to the data stream, wherein the encoding is generated according to a block encoding technique selected based on contents of the block;
determine another block in the binary image with at least one active pixel; and
add another encoding of the other block to the data stream, wherein the other encoding is generated according to a different block encoding technique selected based on contents of the other block.

* * * * *